(12) United States Patent
Easton et al.

(10) Patent No.: US 11,519,947 B2
(45) Date of Patent: Dec. 6, 2022

(54) SMA WIRE RESISTANCE MEASUREMENT

(71) Applicant: CAMBRIDGE MECHATRONICS LIMITED, Cambridge (GB)

(72) Inventors: Mark George Easton, Cambridge (GB); Jonathan Morgan, Cambridge (GB)

(73) Assignee: CAMBRIDGE MECHATRONICS LIMITED, Cambridgeshire (GB)

( * ) Notice: Subject to any disclaimer, the term of this patent is extended or adjusted under 35 U.S.C. 154(b) by 73 days.

(21) Appl. No.: 16/755,038

(22) PCT Filed: Oct. 9, 2018

(86) PCT No.: PCT/GB2018/052876
§ 371 (c)(1),
(2) Date: Apr. 9, 2020

(87) PCT Pub. No.: WO2019/073212
PCT Pub. Date: Apr. 18, 2019

(65) Prior Publication Data
US 2021/0190842 A1    Jun. 24, 2021

(30) Foreign Application Priority Data
Oct. 11, 2017 (GB) ..................... 1716669

(51) Int. Cl.
*G01R 27/02* (2006.01)
*G02B 7/02* (2021.01)
*F03G 7/06* (2006.01)

(52) U.S. Cl.
CPC ............. *G01R 27/02* (2013.01); *G02B 7/02* (2013.01); *F03G 7/065* (2013.01)

(58) Field of Classification Search
CPC ...................................... G01R 27/02
See application file for complete search history.

(56) References Cited

U.S. PATENT DOCUMENTS

| 4,578,667 | A | * | 3/1986 | Hollister | ............. | H03M 1/1047 |
| | | | | | | 341/122 |
| 5,668,320 | A | * | 9/1997 | Cowan | ................... | G01L 9/065 |
| | | | | | | 73/708 |
| 6,574,958 | B1 | * | 6/2003 | MacGregor | ............. | F03G 7/065 |
| | | | | | | 60/527 |
| 6,969,920 | B1 | | 11/2005 | Severinghaus | | |

(Continued)

FOREIGN PATENT DOCUMENTS

GB    2 280 957    2/1995
WO    WO 2014068294    5/2014

*Primary Examiner* — Walter L Lindsay, Jr.
*Assistant Examiner* — Milton Gonzalez
(74) *Attorney, Agent, or Firm* — Haley Guiliano LLP (57) ABSTRACT

An apparatus is disclosed for measuring the resistance of a shape memory alloy, SMA, wire. The apparatus comprises: an SMA wire; a sense resistor connected in series with the SMA wire; a measurement circuit configured to perform a measurement indicative of the potential difference across at least the SMA wire; and a measurement switch between the SMA wire and the sense resistor. The measurement switch is configured to connect either to the measurement circuit such that the measurement circuit can perform the measurement or to a circuit that bypasses the sense resistor.

8 Claims, 8 Drawing Sheets

(56) References Cited

U.S. PATENT DOCUMENTS

| | | | | |
|---|---|---|---|---|
| 8,068,167 B2* | 11/2011 | Honda | .................... | F03G 7/065 |
| | | | | 348/357 |
| 8,174,608 B2* | 5/2012 | Hara | ........................ | G03B 5/00 |
| | | | | 348/357 |
| 8,706,305 B2* | 4/2014 | Jiang | ........................ | F03G 7/065 |
| | | | | 700/275 |
| 9,388,799 B2* | 7/2016 | Easton | .................... | G03B 5/00 |
| 2019/0025973 A1* | 1/2019 | Schmitt | .............. | G01R 31/2829 |
| 2019/0264664 A1* | 8/2019 | Zamani | .................. | F03G 7/065 |

* cited by examiner

SMA WIRE RESISTANCE MEASUREMENT

CROSS-REFERENCE TO RELATED APPLICATIONS

This application is a national stage application under 35 U.S.C. § 371 of International Application PCT/GB2018/052876, filed Oct. 9, 2018, which claims priority of GB Patent Application 1716669.5 filed Oct. 11, 2017. The disclosure of which are hereby incorporated by reference herein in their entireties.

The present application generally relates to measuring the resistance of an SMA wire. More particularly, the present techniques concerns drive circuits for actuators containing shape memory alloy (SMA). In particular embodiments, the present techniques apply to drive circuits that are used to drive SMA actuators in miniature cameras.

According to a first approach of the present techniques, there is provided an apparatus for measuring the resistance of a shape memory alloy (SMA) wire, the apparatus comprising: an SMA wire; a sense resistor connected in series with the SMA wire; a measurement circuit configured to perform a measurement indicative of the potential difference across at least the SMA wire; and a measurement switch between the SMA wire and the sense resistor; wherein the measurement switch is configured to connect either to the measurement circuit such that the measurement circuit can perform the measurement or to a circuit that bypasses the sense resistor.

Such an apparatus improves the efficiency of measuring the resistance of the SMA wire, while maintaining the sensitivity and accuracy. The measurement switch makes it possible to bypass the sense resistor when the SMA wire is driven (i.e. heated) and to switch the sense resistor into the circuit when a measurement is required. It may only be necessary to measure the resistance intermittently. Between measurements, the sense resistor can be bypassed. This reduces the power required to heat the SMA wire, thereby improving the efficiency.

Additionally, it is possible to use only a very short measurement pulse (i.e. input only a small amount of power to the SMA wire) when making a measurement. For example, the measurement pulse can be shorter than the pulses for heating the SMA wire to control its length. By using a short measurement pulse, the measurement can be performed without undesirably heating the SMA wire.

According to a second approach of the present techniques, there is provided an apparatus for measuring the resistance of a shape memory alloy, SMA, wire, the apparatus comprising: an SMA wire; a sense resistor connected in series with the SMA wire; and a measurement circuit configured to perform a measurement indicative of the potential difference across at least the SMA wire relative to a reference potential; wherein the reference potential is connected to a connection potential at the opposite side of the sense resistor from the SMA wire such that the reference potential is equal to the connection potential.

Such an apparatus improves the accuracy of the resistance measurement. This is because by making the connection potential equal to the reference potential, one source of inaccuracy for the measurement is reduced or even eliminated. In particular, it may be that the connection potential varies over time and so is not otherwise necessarily equal to the reference potential. The derivation of the resistance of the SMA wire from the measurement result depends on the ratio of the reference potential to the connection potential. By connecting the reference potential inputs to the connection potential, the output of the measurement is scaled against the same voltage as the connection potential. This can at least reduce the dependency of the resistance measurement on the supply voltage.

According to a third approach of the present techniques, there is provided an apparatus for measuring the resistance of a shape memory alloy, SMA, wire, the apparatus comprising: an SMA wire; a sense resistor connected in series with the SMA wire; a measurement circuit configured to perform a measurement indicative of the potential difference across at least the SMA wire; and a further measurement circuit configured to perform a measurement indicative of the potential difference across the sense resistor.

Such an apparatus improves the accuracy of the resistance measurement. The voltage across the SMA wire and the voltage across the sense resistor are sampled. The resistance of the SMA wire can then be calculated as a ratio of the two voltages because the resistance of the sense resistor is accurately known. This method of measuring resistance is hence independent of the supply voltage.

In one example, the apparatus comprises a sample and hold circuit configured to sample a voltage for inputting to the measurement circuit. The sample and hold circuit may comprise a capacitor for storing charge during the settling time of the measurement circuit.

Such an apparatus improves the timing of the resistance measurement. The capacitor remains charged up and holds the level constant through the period covering the settling time of (e.g. an amplifier of) the measurement circuit. An efficient and quick method of measuring the resistance is realised. The system can wait until the output of the amplifier has settled before triggering a measurement of the amplifier output.

In one example, the apparatus comprises at least one discharge switch arranged in parallel to the capacitor. The discharge switch may be configured to selectably connect the capacitor to a terminal for at least partially discharging the capacitor.

Such an apparatus improves the accuracy of the resistance measurement. The discharge switches allow the capacitors in the sample and hold circuits to be discharged or partially discharged so that there is no cross talk between successive measurements if they are made close to one another.

In one example, the measurement circuit is connected to a terminal between the drive switch (which supplies pulses to the SMA wire) and the SMA wire such that the measurement circuit is configured to perform the measurement indicative of the potential difference across the SMA wire but not across the drive switch.

Such an apparatus improves the accuracy of the resistance measurement. This method of measuring resistance is independent of the resistance of the drive switch. Therefore, the parasitic resistance of the drive switch does not undesirably affect the resistance measurement for the SMA wire.

In an embodiment there is provided an apparatus for measuring the resistance of an SMA comprising: an SMA wire, a sense resistor connected in series with the SMA wire, at least one switch, at least one sample hold circuit, an amplifier configured to measure the potential difference across the SMA wire, and a digital to analogue converter, characterised in that the at least one switch connects either to the sample hold circuit or to a circuit that bypasses the sense resistor.

Preferably the apparatus may further comprise an amplifier configured to measure the potential difference across the sense resistor. Even more preferably the apparatus may further comprise at least one switch arranged in parallel to the capacitor in the sample hold circuit.

In an embodiment there is disclosed a method of measuring the resistance of an SMA wire comprising the following steps: providing the aforementioned apparatus, activating the switches so that the inputs of a first amplifier are configured to measure the potential difference across the sense resistor, activating the switches so that the inputs of a second amplifier are configured to measure the potential difference across the SMA wire, sending a short electrical pulse through the SMA wire and the sense resistor, simultaneously measuring the potential difference across the sense resistor and the SMA wire, and activating the switches so that the potential difference of the SMA wire is not measured and the sense resistor is bypassed.

Preferably the short pulse for measuring the resistance of the SMA is synchronised with the activation of the measurement circuit.

In an embodiment there is provided a method of driving an SMA wire comprising a combination of pulses for heating the SMA wire and a short pulse for measuring the resistance of the SMA wire, characterised in that short pulse for measuring the resistance of the SMA is synchronised with the activation of the measurement circuit.

Preferably the drive pulse and the measurement pulse are of a different functional form.

The apparatus described herein may be incorporated into any device containing a shape memory alloy actuator. The device may be any one of the following: a smartphone, a camera, a foldable smartphone, a foldable smartphone camera, a camera with folded optics, a foldable consumer electronics device, an image capture device, an array camera, a 3D sensing device or system, a servomotor, a consumer electronic device, a mobile computing device, a mobile electronic device, a laptop, a tablet computing device, an e-reader (also known as an e-book reader or e-book device), a computing accessory or computing peripheral device (e.g. mouse, keyboard, headphones, earphones, earbuds, etc.), a security system, a gaming system, a gaming accessory (e.g. controller, headset, a wearable controller, etc.), an augmented reality system, an augmented reality device, a virtual reality system, a virtual reality device, a wearable device (e.g. a watch, a smartwatch, a fitness tracker, etc.), a medical device (e.g. an endoscope), a haptics device or haptics button, a drone (aerial, water, underwater, etc.), a robot or robotics device, an aircraft, a spacecraft, a submersible vessel, a vehicle, and an autonomous vehicle. It will be understood that this is a non-exhaustive list of example devices.

In a related approach of the present techniques, there is provided a non-transitory data carrier carrying processor control code to implement any of the methods described herein.

Preferred features are set out in the appended dependent claims.

As will be appreciated by one skilled in the art, the present techniques may be embodied as a system, method or computer program product. Accordingly, present techniques may take the form of an entirely hardware embodiment, an entirely software embodiment, or an embodiment combining software and hardware aspects.

Furthermore, the present techniques may take the form of a computer program product embodied in a computer readable medium having computer readable program code embodied thereon. The computer readable medium may be a computer readable signal medium or a computer readable storage medium. A computer readable medium may be, for example, but is not limited to, an electronic, magnetic, optical, electromagnetic, infrared, or semiconductor system, apparatus, or device, or any suitable combination of the foregoing.

Computer program code for carrying out operations of the present techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

Embodiments of the present techniques also provide a non-transitory data carrier carrying code which, when implemented on a processor, causes the processor to carry out any of the methods described herein.

The techniques further provide processor control code to implement the above-described methods, for example on a general purpose computer system or on a digital signal processor (DSP). The techniques also provide a carrier carrying processor control code to, when running, implement any of the above methods, in particular on a non-transitory data carrier. The code may be provided on a carrier such as a disk, a microprocessor, CD- or DVD-ROM, programmed memory such as non-volatile memory (e.g. Flash) or read-only memory (firmware), or on a data carrier such as an optical or electrical signal carrier. Code (and/or data) to implement embodiments of the techniques described herein may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog® or VHDL (Very high speed integrated circuit Hardware Description Language). As the skilled person will appreciate, such code and/or data may be distributed between a plurality of coupled components in communication with one another. The techniques may comprise a controller which includes a microprocessor, working memory and program memory coupled to one or more of the components of the system.

It will also be clear to one of skill in the art that all or part of a logical method according to embodiments of the present techniques may suitably be embodied in a logic apparatus comprising logic elements to perform the steps of the above-described methods, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In an embodiment, the present techniques may be realised in the form of a data carrier having functional data thereon, said functional data comprising functional computer data structures to, when loaded into a computer system or network and operated upon thereby, enable said computer system to perform all the steps of the above-described method.

Implementations of the present techniques will now be described, by way of example only, with reference to the accompanying drawings, in which.

Broadly speaking, the present techniques provide apparatus and methods for measuring the resistance of a shape memory alloy (SMA) wire. The SMA wire may be in an SMA actuator or SMA actuator assembly which comprises a static part and a moveable part that moves relative to the static part. The SMA actuator assembly may be provided in any device, such as: a smartphone, a camera, a foldable smartphone, a foldable smartphone camera, a foldable consumer electronics device, an image capture device, a 3D sensing device or system, a servomotor, a consumer electronic device, a mobile computing device, a mobile electronic device, a laptop, a tablet computing device, an e-reader (also known as an e-book reader or e-book device), a computing accessory or computing peripheral device (e.g. mouse, keyboard, headphones, earphones, earbuds, etc.), a security system, a gaming system, a gaming accessory (e.g. controller, headset, a wearable controller, etc.), an augmented reality system, an augmented reality device, a virtual reality system, a virtual reality device, a wearable device (e.g. a watch, a smartwatch, a fitness tracker, etc.), a medical device (e.g. an endoscope), a drone (aerial, water, underwater, etc.), an aircraft, a spacecraft, a submersible vessel, a vehicle, and an autonomous vehicle. It will be understood that this is a non-exhaustive list of example devices. It will also be understood that while some of the following description explicitly mentions cameras or miniature cameras, this is merely one illustrative example device which may incorporate SMA actuators.

Miniature cameras are included in a wide range of consumer electronic devices. The miniature camera comprises an image sensor positioned orthogonally to the optical axis of a lens barrel. Actuators are commonly attached to the lens to achieve two functions: an actuator that moves the lens along its optical axis with respect to the image sensor in response to a control signal from the electronic device provides autofocus; and an actuator that moves the lens barrels in the two directions orthogonal to its optical axis in response to a control signal from the electronic device provides optical image stabilisation. Example devices are shown in International Patent Publication Nos. WO2007/113478, WO2007/113478, WO2011/104518, WO2012/066285 and WO2014/076463.

One method of providing the driving force is to use shape memory alloy (SMA). A shape memory alloy is a material that changes shape over temperature as it transitions from a martensite to an austenite phase. When the wire is heated it shortens in length and when it cools it becomes more elastic and can be stretched by applying a force. In an actuator an SMA wire is used so that it can respond quickly when heated, typically by applying an electric current and relying on the resistance of the wire to dissipate power. The SMA is returned to a longer state by taking advantage of its elasticity when cooled and applying an opposing force, which might be provided by resilient means or another SMA wire.

For positioning applications, it is essential to be able to measure the length of each SMA wire. This is complicated because a wire can be several different lengths at a given temperature dependent on the stress that is applied to it, which is generally unknown in a complex actuator design with several wires providing the movement. The measure of length is typically achieved by measuring resistance as it is directly related to the length and diameter of the wire.

Knowledge of the resistance is also required as precisely changing the length will need a calculated change in wire temperature and therefore the wire needs to be driven by a precise amount of power. Typically, wires are driven by a pulse, where the width is changed to deliver the desired amount of power—i.e. a pulse width modulated (PWM) control. The measurement of resistance for a wire necessarily requires an electric potential and it is therefore common to measure the resistance whilst the wire is being driven. In a miniature camera actuator pulse width can be of the order of ~1 µs in duration. Measuring the resistance of the wire accurately over such a short time period is challenging.

In the prior art, the SMA wire is driven in series with a sense resistor. To determine the resistance either the potential difference across the sense resistor or the potential difference across the SMA wire to ground is measured. The system is configured so that the potential difference measured is compared to an offset value. The small difference between the potential measured and the offset is then amplified to improve accuracy.

There are a number of drawbacks to this approach:

One drawback is that this approach assumes the drive voltage is constant and is known precisely, which means that any noise or power dependent ripple on the voltage source is a major cause of error in resistance measurement. The mathematical transformation from the potential difference to wire resistance requires the drive voltage as an input.

Another drawback is that this system can only measure the resistance of the SMA wire summed with any other parasitic series resistances, including the MOSFET resistance used to switch power into the wire.

Another drawback is that the settling time of the amplifier needs to be less than the minimum drive time. Given the significant amplifier gain required, this can be technically challenging, requiring an amplifier with a wide bandwidth.

Accordingly, an alternative method of measuring the resistance is required.

It is an object of the present techniques to overcome one or more of these problems and to produce an improved method of measuring the resistance of an SMA wire, or at least to produce a commercially attractive, novel and inventive alternative.

Figure 1:
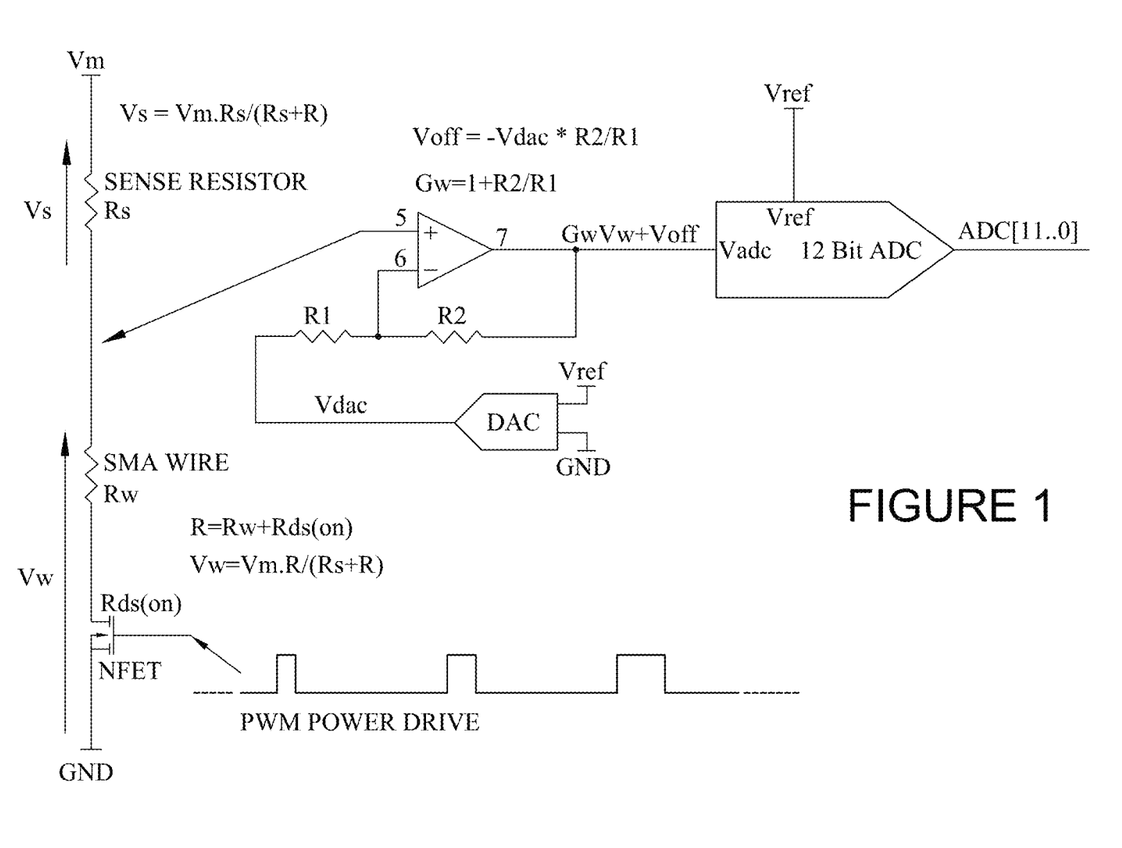
FIG. 1 is a schematic diagram of a prior art SMA drive and sense circuit.

A schematic of a prior art drive circuit is shown in FIG. 1. An SMA wire of resistance Rw is placed in series with a sense resistor of resistance Rs, between a connection at a supply potential Vm and ground GND. A drive switch, which may be implemented as an NFET switch for example, is placed between the SMA wire and ground. The drive switch has a resistance Rds(on). When the drive switch is activated (i.e. closed), current is able to flow through the SMA wire, thereby heating it. A control system opens and closes the drive switch, using a PWM controller (which may also be called a PWM power drive) for example, thereby controlling the power delivered to the SMA load. As shown in FIG. 1, there is a potential difference Vw across the SMA wire to ground. There is a potential difference Vs across the sense resistor.

The sensing side of the circuit is connected between the sense resistor and the SMA wire to measure the potential difference Vw across the SMA wire to ground. The potential difference Vw is fed into an amplifier along with an offset potential Voff generated by a digital-to-analog converter DAC, which can generate a value between a reference potential Vref and ground. The reference potential Vref is nominally equal to the supply potential Vm. The amplifier is configured so that it amplifies the difference between the offset potential Voff and the potential difference Vw so that the gain Gw is applied to a lower potential and the accuracy of the measurement is increased. The gain Gw is controlled by choosing suitable values for the resistors of the measurement circuit which have resistances R1 and R2. The output is fed into an analog-to-digital converter ADC, which scales the result against the reference potential Vref and outputs the value to a control algorithm. The control algorithm may be run by the control system. The control algorithm may determine the resistance Rw based on the output of the sensing side of the circuit.

There are a number of drawbacks to the circuit shown in FIG. 1. One drawback is that this approach assumes the supply potential Vm (which may also be called the drive voltage) is constant and is known precisely. As a result, any noise or power-dependent ripple on the voltage source is a cause of error in the resistance measurement. The mathematical transformation from the potential difference Vw to the SMA wire resistance Rw requires the supply potential Vm as an input. Specifically, from the relations for the potential difference Vw and the resistance R shown in FIG. 1, it can be determined that:

$$Rw = Rs\left(\frac{1}{1 - \frac{Vm}{Vw}}\right) - Rds(on)$$

As mentioned above, the potential difference Vw is measured scaled relative to the reference potential Vref. Rewriting the above equation in terms of the measured ratio of the potential difference Vw to the reference potential Vref gives:

$$Rw = Rs\left(\frac{\frac{Vw}{Vreg}}{\frac{Vw}{Vref} - \frac{Vm}{Vref}}\right) - Rds(on)$$

Hence, it is necessary to know the ratio of the supply potential Vm to the reference potential Vref. As an approximation, this ratio can be assumed to be constant at 1. However, one source of inaccuracy is that the supply potential Vm can vary over time and so is not necessarily equal to Vref. The mathematical transformation from the ADC output (i.e. the measured ratio of the potential difference Vw to the reference potential Vref) to the SMA wire resistance Rw requires ratio of the reference potential Vref to the supply potential Vm as an input.

Figure 2:
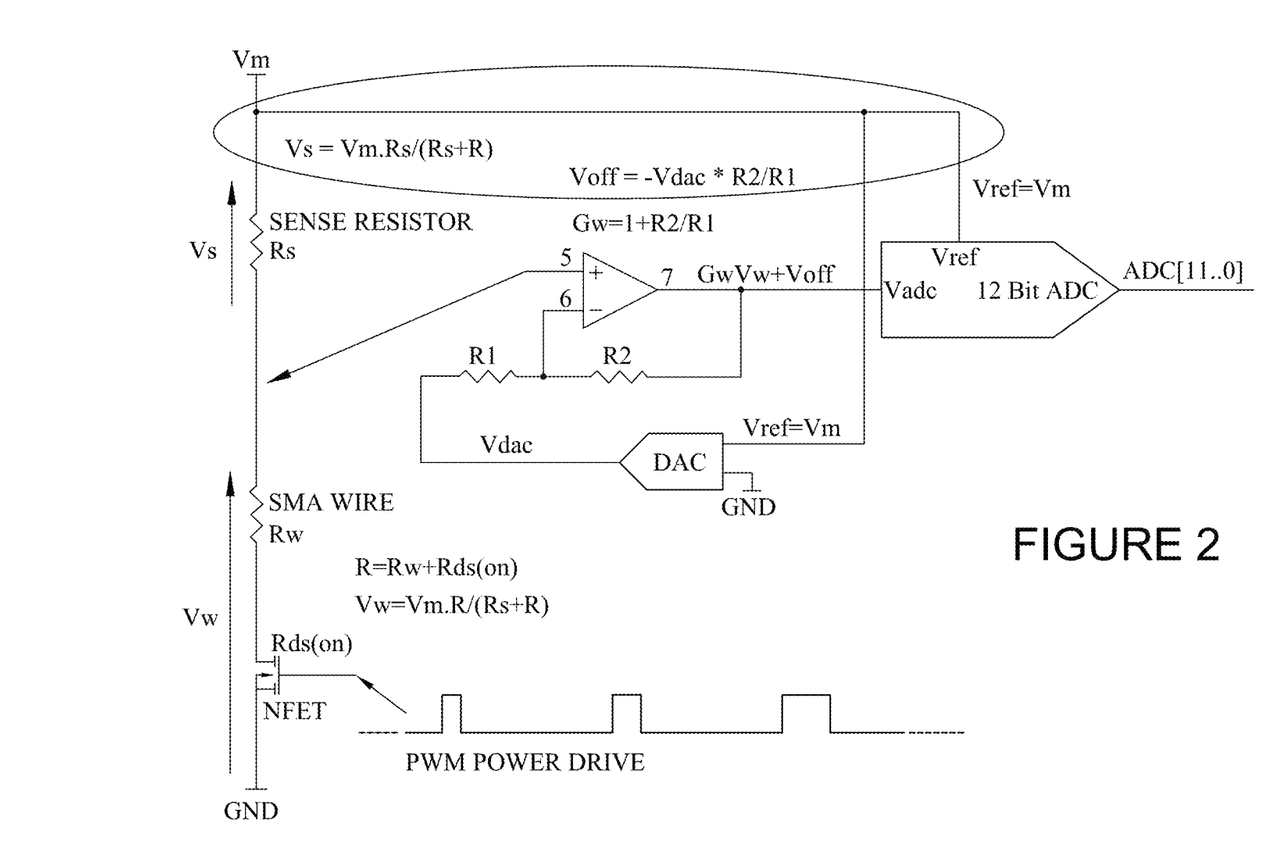
FIG. 2 is a schematic diagram of an alternative drive and sense circuit.

FIG. 2 schematically depicts an apparatus for measuring the resistance Rw of the SMA wire according to an embodiment of the present techniques. As shown in FIG. 2, the apparatus comprises an SMA wire of resistance Rw and a sense resistor of resistance Rs connected in series with the SMA wire. The resistance Rs of the sense resistor is accurately known.

As shown in FIG. 2, the apparatus further comprises a measurement circuit. In the example shown in FIG. 2, the measurement circuit comprises an amplifier, a digital-to-analog converter DAC and an analog-to-digital converter ADC. The measurement circuit is configured to perform a measurement indicative of the potential difference Vw across at least the SMA wire relative to a reference potential Vref.

The SMA wire and the sense resistor are between a connection at the supply potential Vm and ground GND. The drive switch NFET (although it is not essential for the drive switch to be implemented as an NFET) is between the SMA wire and ground GND. The drive switch has a resistance Rds(on).

When the drive switch is activated (i.e. closed), current is able to flow through the SMA wire, thereby heating it. A controller is configured to control opening and closing of the drive switch. The controller may use a PWM power drive. There is a potential difference Vs across the sense resistor.

The measurement circuit is connected between the sense resistor and the SMA wire so as to measure the potential difference Vw across the SMA wire to ground. The potential difference Vw is connected to the measurement circuit. In one example, the measurement circuit comprises an amplifier. The potential difference Vw may be connected to the amplifier of the measurement circuit. An offset potential Voff may be connected to the amplifier. The offset potential Voff is generated by a digital-to-analog converter DAC. The digital-to-analog converter DAC is configured to generate a value between the reference potential Vref and ground GND.

The amplifier may be configured to amplify the difference between potential difference Vw across at least the sense resistor and an offset potential Voff. The amplifier amplifies the difference between the offset potential Voff and the potential difference Vw so that the gain Gw is applied to a lower potential and the accuracy of the measurement is increased. The gain Gw is controlled by choosing suitable values for the resistors of the measurement circuit which have resistances R1 and R2. In particular, the gain Gw can be controlled according to the following formula:

$$Gw = 1 - R2/R1$$

The output of the amplifier (GwVw+Voff) is connected to an analog-to-digital converter ADC. The analog-to-digital converter ADC is configured to scale the output of the amplifier against the reference potential Vref. The analog-to-digital converter ADC is configured to output the scaled value to a control algorithm. The control algorithm may be run by the controller. The control algorithm may determine the resistance Rw based on the output of the scaled value output be the measurement circuit.

As shown in ringed part of FIG. 2, the reference potential Vref is connected to the supply potential Vm at the opposite side of the sense resistor from the SMA wire such that the reference potential Vref is equal to the supply potential Vm. The apparatus shown in FIG. 2 is expected to overcome the inaccuracy caused by the supply potential Vm not being constant. The inputs for the reference potential Vref are connected to the supply potential Vm so that the output of the analog-to-digital converter ADC is scaled against the same voltage, shown schematically in FIG. 2.

The apparatus shown in FIG. 2 is expected to make the measurement of the SMA wire resistance Rw less dependent on the supply voltage. In particular, when the reference potential Vref is equal to the supply potential Vm, the above equation simplifies to:

$$Rw = Rs \left( \frac{\frac{Vw}{Vref}}{\frac{Vw}{Vref} - 1} \right) - Rds(on)$$

This equation is independent of the supply potential Vm. The modification shown in FIG. 2 provides an improvement in precision relative to the circuit shown in FIG. 1.

As explained above, placing an SMA wire in series with a sense resistor allows the resistance Rw of the SMA wire to be measured. However, there is a drawback that this can be inefficient because the sense resistor consumes power as well as the SMA wire.

In one embodiment, the resistance value Rs of the sense resistor is no more than about 20%, and optionally no more than about 10% of the resistance Rw of the SMA wire. This reduces the power consumed by the sense resistor, thereby improving the power efficiency.

In an alternative embodiment, the resistance Rs of the sense resistor is within 20%, and optionally within 10%, of the resistance Rw of the SMA wire at standard temperature and pressure. The resistance Rs of the sense resistor may be equal to the resistance Rw of the SMA wire at standard temperature and pressure. By providing that the resistance Rs is close to or approximately equal to the resistance Rw, the measurement accuracy is increased. This is because such a configuration increases the voltage change to be measured.

Figure 3:
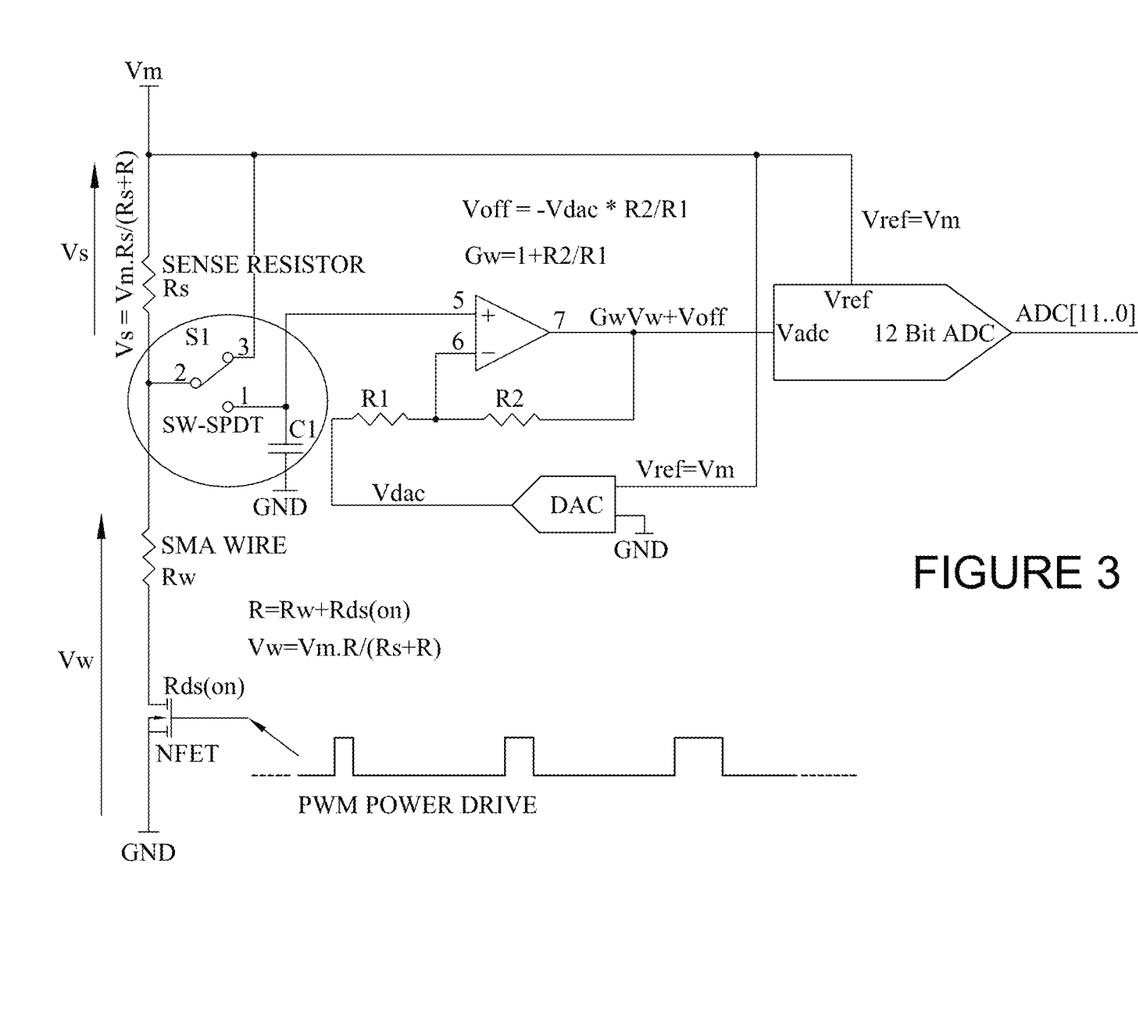
FIG. 3 is a schematic diagram of an improved drive and sense circuit.

FIG. 3 schematically depicts an apparatus for measuring the resistance Rw of the SMA wire according to an embodiment of the present techniques. Some of the components are the same as those of the apparatus shown in FIG. 2. These components will not be described again in detail.

As shown in FIG. 3, the apparatus comprises an SMA wire, a sense resistor connected in series with the SMA wire, and a measurement circuit. The measurement circuit is configured to perform a measurement indicative of the potential difference across at least the SMA wire.

As shown in FIG. 3, the apparatus comprises a measurement switch S1 between the SMA wire and the sense resistor. Optionally, the measurement switch S1 is a single-pole, double-throw switch.

As shown in FIG. 3, the measurement switch S1 is configured to connect either to the measurement circuit such that the measurement circuit can perform the measurement or to a circuit that bypasses the sense resistor.

The apparatus shown in FIG. 3 is expected to make the measurement more efficient and remain sensitive and accurate. The measurement switch S1 bypasses the sense resistor when the wire is driven and switches the sense resistor into the circuit when a measurement is required. Power is dissipated by the sense resistor only when the sense resistor is needed for performing a resistance measurement. When the sense resistor is not required (because no measurement is being made), power is not dissipated by the sense resistor. This reduces the power used.

Optionally, the frequency for heating the SMA wire is greater than the frequency of taking the resistance measurements. As mentioned above, a controller is configured to control voltage pulses supplied to the SMA wire. Some pulses are for heating the SMA wire, so as to control its length. Other pulses are for measuring the resistance of the SMA wire. The frequency of pulses for heating is greater than the frequency of pulses for measurements.

For example, the SMA wire may be controlled (i.e. supplied with pulses for heating) approximately on a 40 kHz PWM frequency. Meanwhile, resistance measurement is only required at around 2.5 kHz. The measurement pulses may be separated from the drive pulses (i.e. heating pulses) in the waveform of pulses supplied by the controller. Optionally, the measurement pulses have a length of the order of 1 μs. This means that a measurement can be performed without significantly adding heat to the SMA wire.

As illustrated in FIG. 3, the SMA wire and sense resistor are arranged in series. The measurement switch S1 with three terminals is placed between the two SMA wire and the sense resistor. Terminal 1 is connected to a sample and hold circuit that feeds into the sensing amplifier. Terminal 2 is connected between the SMA wire and the sense resistor. Terminal 3 is connected to the supply potential line. When the measurement switch S1 is connected between terminals 2 and 3, the SMA wire is driven (i.e. heated) and the sense resistor is bypassed, giving an efficient drive.

As shown in FIG. 3, the sample and hold circuit may comprise a capacitor C1 for storing charge. More particularly, the capacitor C1 is configured to store charge during the settling time of the measurement circuit. This addresses the issue of the electronic amplifier of the measurement circuit having response and settling times. This issue is particularly important when the measurement pulses are short. Otherwise, the settling time of the amplifier needs to be less than the minimum drive time. Given the significant amplifier gain Gw required, this can be technically challenging, requiring an amplifier with a wide bandwidth. By providing the capacitor C1, a greater range of different amplifiers can be used.

The resistance Rw of the SMA wire can be measured according to the following process. The measurement switch S1 is connected between terminals 1 and 2 such that the sense resistor is switched into the circuit. A short measurement pulse is fed through the SMA wire and the sense resistor by activating the drive switch between ground GND and the SMA wire. The short pulse charges capacitor C1, which is coupled to a high impedance amplifier. The switch S1 can then be switched again so that the SMA wire is available to be driven for actuation. Although S1 is switched, the capacitor remains charged up and holds the level constant through the period covering the settling time of the amplifier. The rest of the circuit is configured as in earlier examples and thereby an efficient and quick method of measuring the resistance Rw is realised. The system can wait until the output of the amplifier has settled before triggering the ADC to measure the amplifier output.

Figure 7:
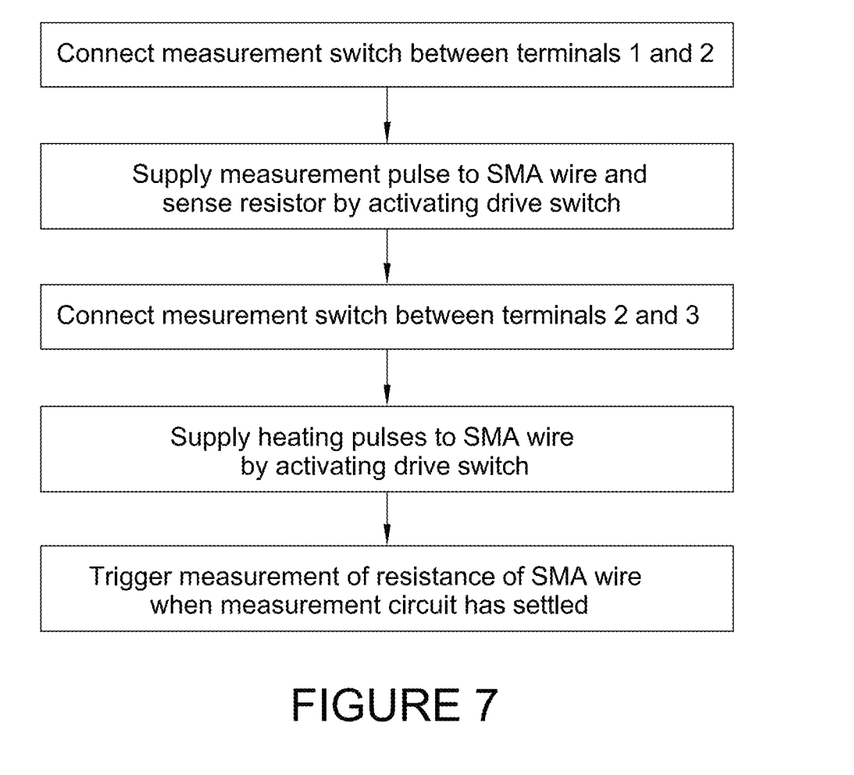
FIG. 7 is a flow chart for a method of measuring the resistance of the SMA wire using the circuit shown in FIG. 3.

FIG. 7 is a flow chart showing a method of driving the SMA wire using the apparatus shown in FIG. 3. The controller is configured to perform the method. As shown in FIG. 7, the method comprises connecting the measurement switch S1 between terminal 1 and 2. The method comprises intermittently (because the process shown in FIG. 7 is repeated) supplying measurement pulses such that a current flows through the SMA wire and the sense resistor connected in series with the SMA wire. The method comprises connecting the measurement switch S1 between terminals 2 and 3. The method comprises supplying heating pulses such that a current flows through the SMA wire so as to heat the SMA wire, thereby controlling its length.

The method comprises supplying measurement activation signals so as to activate the measurement circuit to perform a measurement indicative of the resistance of the SMA wire. The measurement pulses may be synchronised with the measurement activation signals. In particular, they are caused to occur at the same rate. Each measurement activation signal may be supplied a period of time after a corresponding measurement pulse is supplied. This period of time allows the amplifier of the measurement circuit to settle.

Figure 4:
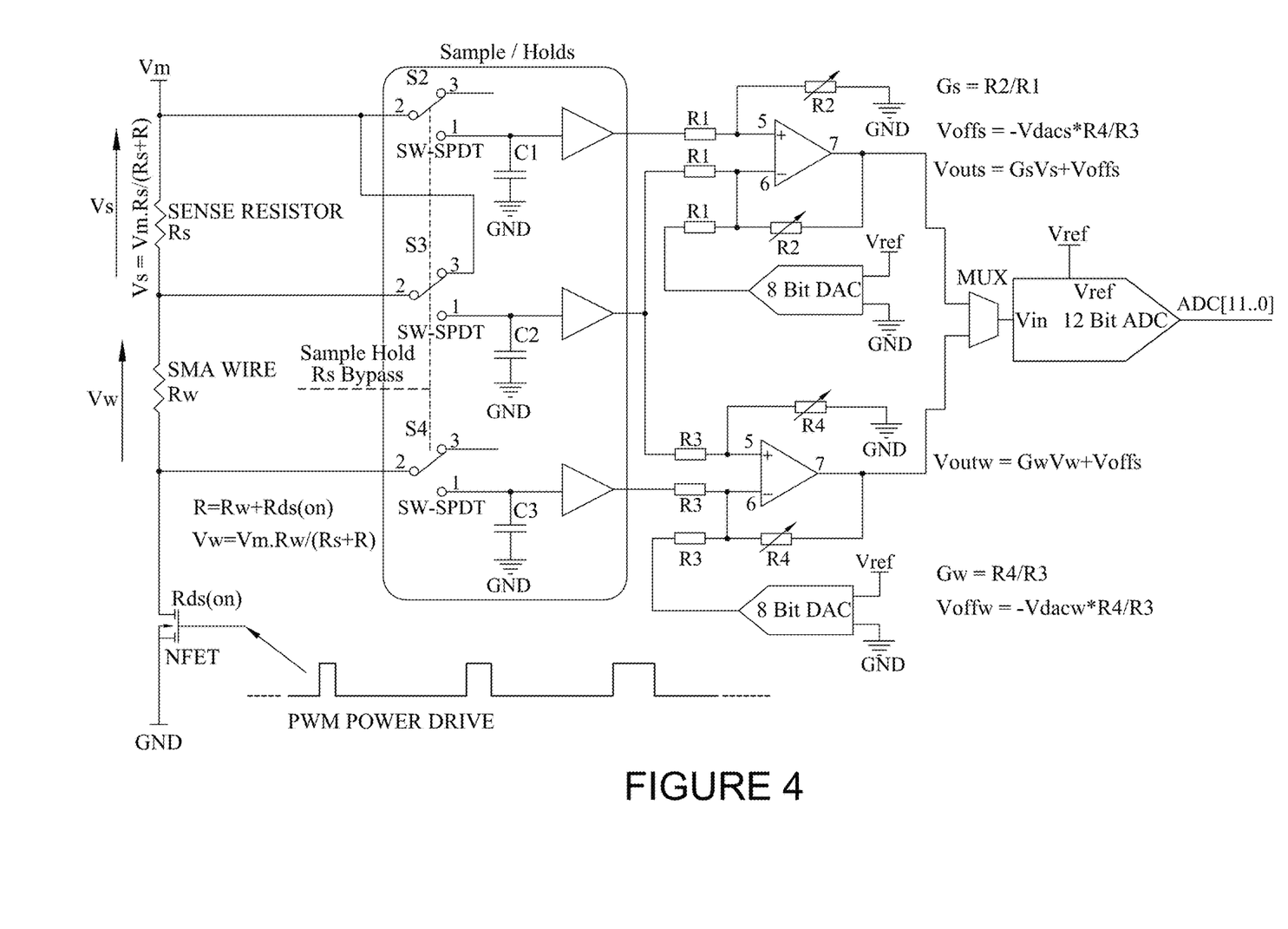
FIG. 4 is a schematic diagram of an alternative improved drive and sense circuit.

FIG. 4 schematically depicts an apparatus for measuring the resistance Rw of the SMA wire according to an embodiment of the present techniques. Some of the components are the same as those of the apparatus shown in FIG. 2 or FIG. 3. These components will not be described again in detail.

As shown in FIG. 4, the apparatus comprises an SMA wire, a sense resistor connected in series with the SMA wire, and a measurement circuit configured to perform a measurement indicative of the potential difference Vw across at least the SMA wire. As shown in FIG. 4, the apparatus further comprises a further measurement circuit configured to perform a measurement indicative of the potential difference Vs across the sense resistor.

This configuration allows the voltage across the SMA wire and the voltage across the sense resistor to be sampled simultaneously. The resistance Rw of the SMA wire can then be calculated as a ratio of the two voltages because the resistance of the sense resistor is accurately known. This apparatus can measure the resistance independently of the supply potential Vm.

As shown in FIG. 4, the apparatus comprises a plurality of measurement switches. The measurement switch S3 may be substantially the same as the measurement switch S1 described above in relation to FIG. 3. The measurement switch S2 has a terminal 2 connected to the supply potential Vm side of the sense resistor, a terminal 3 connected to open circuit and a terminal 1 connected into a sample and hold circuit element of the further measurement circuit.

The output of the sample and hold elements are fed into two amplifiers. The amplifier of the measurement circuit is configured to measure the potential difference across at least the SMA wire Vw. The amplifier of the further measurement circuit is configured to measure the potential difference Vs across the sense resistor using signals from measurement switches S2 and S3. Reference/offset voltages are fed into the amplifiers in the same manner as described in previous examples. These reference voltages may be different from each other as long as they are known and are selected to give good sensitivity and accuracy in the measurement of the potential differences Vs and Vw.

In the circuit shown in FIG. 4, the signals are multiplexed into a single analog-to-digital converter ADC. In an alternative arrangement, two analog-to-digital converters may be used. The ratio of the potential difference Vs across the sense resistor and the potential difference across the SMA wire Vw is used to derive the resistance Rw of the SMA wire. The mathematical transformation from the output of the analog-to-digital converter ADC to wire resistance Rw is independent of the supply potential Vm.

In particular, the potential difference Vs across the sense resistor and the potential difference Vw across the SMA wire and the drive switch NFET follow the following equations:

$$Vs = Vm\frac{Rs}{Rs + R}$$

$$Vw = Vm\frac{R}{Rs + R}$$

Accordingly, the resistance R can be calculated as:

$$R = Rs\frac{Vw}{Vm}$$

As shown in FIG. 4, the measurement circuit may be connected to a terminal between the drive switch NFET and the SMA wire such that the measurement circuit is configured to perform the measurement indicative of the potential difference Vw across the SMA wire but not across the drive switch NFET.

Such an apparatus is expected to take advantage of the aforementioned improvements in accuracy and timing and additionally reduce or remove parasitic resistance error. The parasitic error may otherwise be cause by the resistance Rds(on) of the drive switch NFET. The measurement is less susceptible to error caused by parasitic resistance of the drive switch NFET. This system can measure the resistance Rw of the SMA wire alone, rather than the resistance Rw of the SMA wire summed with other parasitic series resistances, including the MOSFET resistance used to switch power into the SMA wire.

As shown in FIG. 4, the apparatus may comprise three controllable measurement switches S2-S4. Each measurement switch is connected to a sample and hold circuit element comprising a capacitor C1-C3 and a high impedance buffer. The measurement switch S4 is connected between the SMA wire and the drive switch NFET via terminal 2, with terminal 3 being connected to open circuit and terminal 1 being connected to a sample and hold circuit element.

The amplifier of the measurement circuit configured to measure the potential difference across the SMA wire Vw using signals from measurement switches S3 and S4. The mathematical transformation from the output of the analog-to-digital converter ADC to wire resistance Rw is independent of the resistance Rds(on) of the drive switch NFET.

In particular, the potential difference Vs across the sense resistor and the potential difference Vw across the SMA wire and the drive switch NFET follow the following equations:

$$Vs = Vm\frac{Rs}{Rs + R}$$

$$Vw = Vm\frac{Rw}{Rs + R}$$

Accordingly, the resistance Rw of the SMA wire can be calculated as:

$$Rw = Rs\frac{Vw}{Vm}$$

An exemplary sequence for measuring the potential difference Vw at a point in time using the apparatus shown in FIG. 4 is described below.

In the drive state (i.e. for heating the SMA wire) the measurement switch S2 connects between terminals 2 and 3, and the measurement switch S3 connects between terminals 2 and 3 so that the sense resistor is bypassed, and the measurement switch S4 connects between terminals 2 and 3. When a measurement is required, the measurement circuits are armed by switching the measurement switches S2, S3 and S4 between terminals 1 and 2 and sending a short measurement pulse into the circuit via the drive switch NFET. The measurement pulse charges the capacitors C1, C2 and C3, which store the charge and via the high impedance buffer hold the lines into the two amplifiers at a constant voltage, so that a measurement can be made independently of the settling time of the amplifier. The values of capacitance and the high impedance buffers are selected so that there is not a significant leakage current for the duration of the measurement.

It should be appreciated that once the measurement pulse has been delivered, the measurement switches S2, S3 and S4 can each respectively be returned to connections between terminals 2 and 3, so that further drive signals do not affect the resistance measurement.

Figure 8:
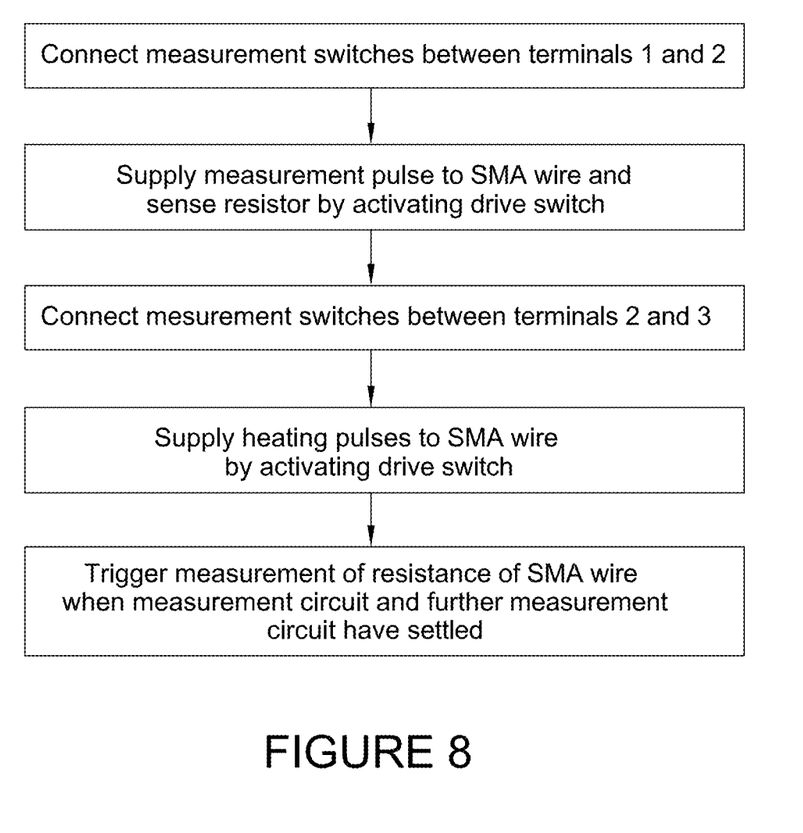
FIG. 8 is a flow chart for a method of measuring the resistance of the SMA wire using the circuit shown in FIG. 4.

FIG. 8 is a flow chart showing a method of driving the SMA wire using the apparatus shown in FIG. 4. The controller is configured to perform the method. As shown in FIG. 8, the method comprises connecting the measurement switches S2-S4 between terminal 1 and 2. The method comprises intermittently (because the process shown in FIG. 8 is repeated) supplying measurement pulses such that a current flows through the SMA wire and the sense resistor connected in series with the SMA wire. The method comprises connecting the measurement switches S2-S4 between terminals 2 and 3. The method comprises supplying heating pulses such that a current flows through the SMA wire so as to heat the SMA wire, thereby controlling its length.

The method comprises supplying measurement activation signals so as to activate the measurement circuit and the further measurement circuit to perform a measurement indicative of the resistance of the SMA wire. The measurement pulses may be synchronised with the measurement activation signals. In particular, they are caused to occur at the same rate. Each measurement activation signal may be supplied a period of time after a corresponding measurement pulse is supplied. This period of time allows the amplifier of the measurement circuit and the amplifier of the further measurement circuit to settle.

Figure 5:
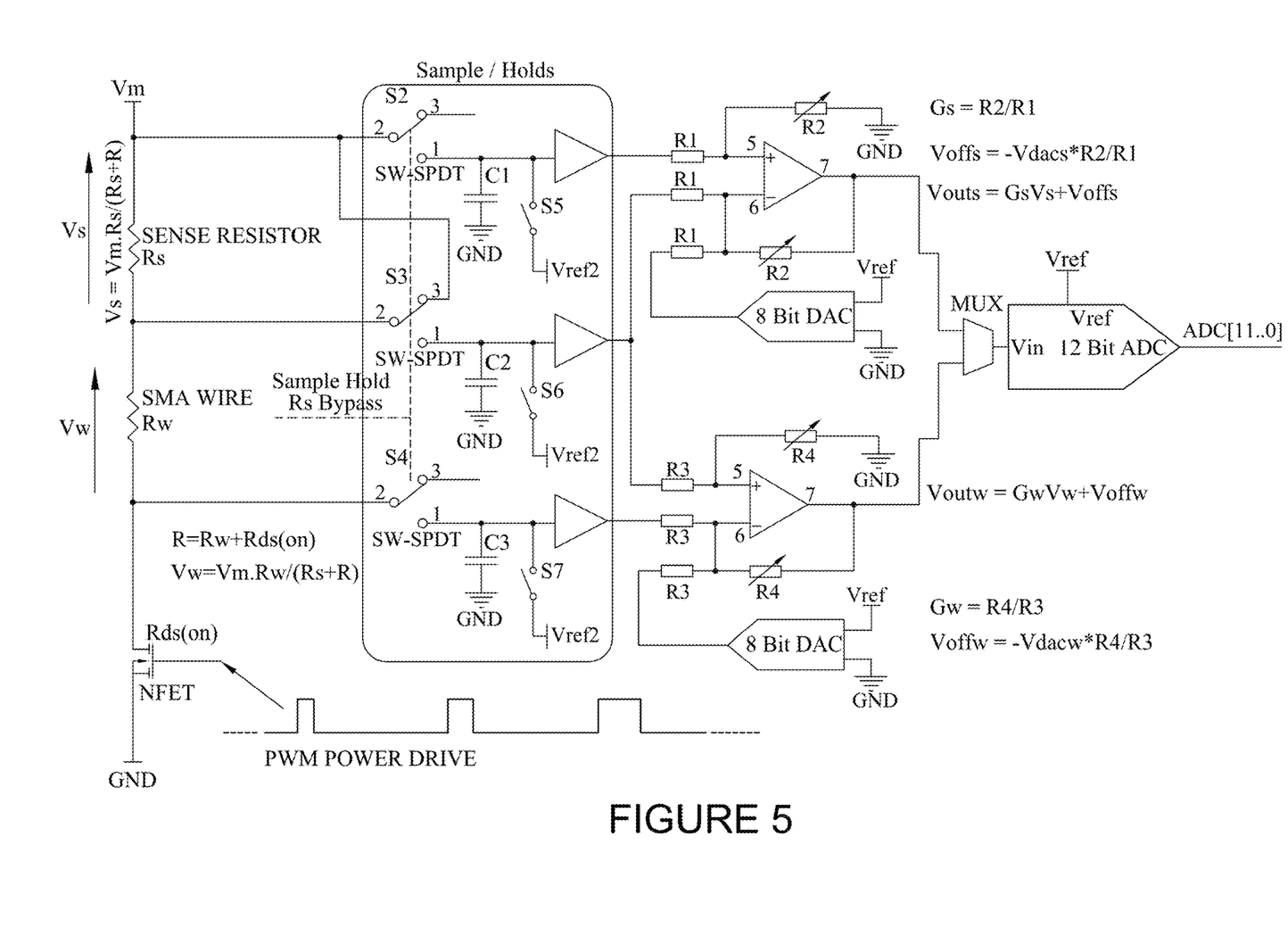
FIG. 5 is a schematic diagram of a further alternative improved drive and sense circuit.

FIG. 5 schematically depicts an apparatus for measuring the resistance Rw of the SMA wire according to an embodiment of the present techniques. Some of the components are the same as those of the apparatus shown in FIG. 2, FIG. 3 or FIG. 4. These components will not be described again in detail.

As shown in FIG. 4 the apparatus comprises at least one discharge switch S5-S7 arranged in parallel to a corresponding capacitor C1-C3. The at least one discharge switch S5-S7 is configured to selectably connect the capacitor C1-C3 to a terminal for at least partially discharging the capacitor C1-C3.

A further improvement to the apparatus is shown in FIG. 5. In FIG. 5 discharge switches S5-S7 have been added to allow the capacitors C1-C3 in the sample and hold circuit elements to be discharged or partially discharged so that there is reduced cross talk between successive measurements. This is particularly important if successive measurements are made close to one another.

Figure 9:
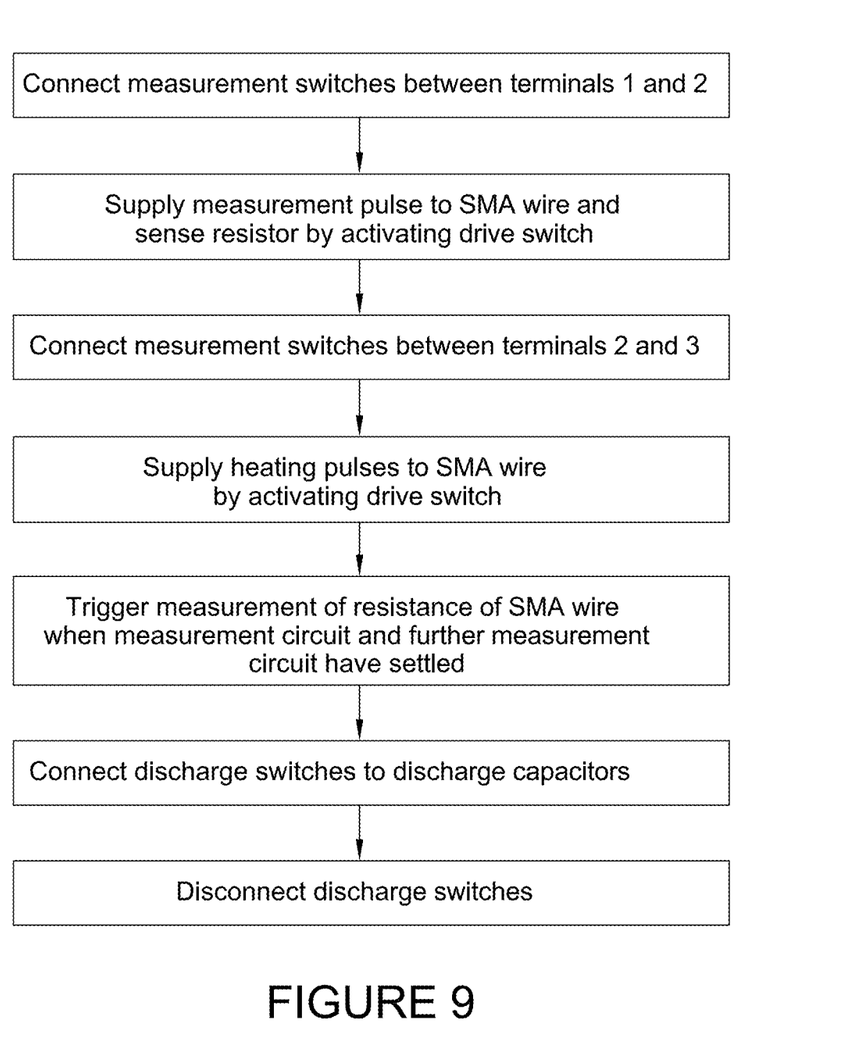
FIG. 9 is a flow chart for a method of measuring the resistance of the SMA wire using the circuit shown in FIG. 5.

FIG. 9 is a flow chart showing a method of driving the SMA wire using the apparatus shown in FIG. 5. The controller is configured to perform the method. As shown in FIG. 9, the method comprises connecting the measurement switches S2-S4 between terminal 1 and 2. The method comprises intermittently (because the process shown in FIG. 8 is repeated) supplying measurement pulses such that a current flows through the SMA wire and the sense resistor connected in series with the SMA wire. The method comprises connecting the measurement switches S2-S4 between terminals 2 and 3. The method comprises supplying heating pulses such that a current flows through the SMA wire so as to heat the SMA wire, thereby controlling its length.

The method comprises supplying measurement activation signals so as to activate the measurement circuit and the further measurement circuit to perform a measurement indicative of the resistance of the SMA wire. The measurement pulses may be synchronised with the measurement activation signals. In particular, they are caused to occur at the same rate. Each measurement activation signal may be supplied a period of time after a corresponding measurement pulse is supplied. This period of time allows the amplifier of the measurement circuit and the amplifier of the further measurement circuit to settle.

The method comprises connecting (i.e. closing) the discharge switches S5-S7 so as to at least partially discharge the capacitors C1-C3. Once the capacitors C1-C3 have been discharged, the discharge switches S5-S7 are disconnected (i.e. opened).

The circuits in FIG. 4 or 5 allow a variety of waveforms to be used for driving the SMA wire without affecting the accuracy of the measurement. This is useful for example, if the SMA wire is in close proximity to a device that is sensitive to electromagnetic radiation at high frequencies, which can be the case if the SMA actuator is used in a miniature camera, where an SMA wire is in close proximity to an image sensor. In this example rounded pulses could be used to drive power into the actuator so that the high frequencies generated by using square pulses are avoided and interference with the image sensor is thereby reduced. Only on the infrequent periods when resistance needs to be measured, would pulses with fast transitions be applied to the SMA wire. A mechanism to change between slow slew rate when driving power and a fast slew rate when measuring resistance may be implemented by the controller as shown in FIG. 6.

Figure 6:
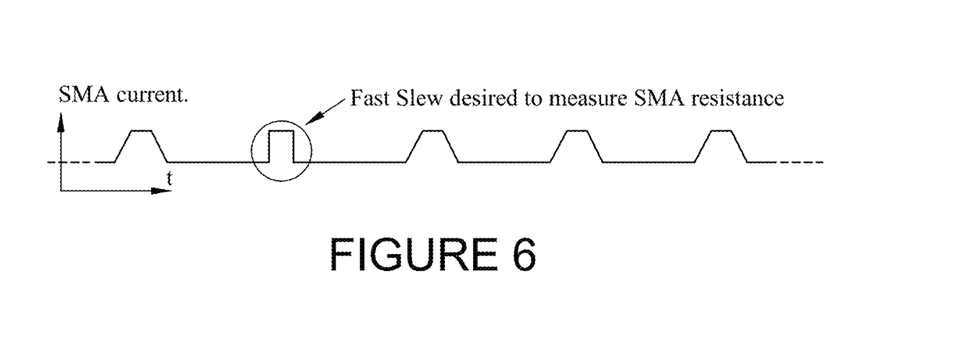
FIG. 6 is a diagram of an example drive and sense pulse train for the SMA wire.

As shown in FIG. 6, the measurement pulses may be shorter than the heating pulses. The heating pulse and the measurement pulse may be of a different functional form. For example, as shown in FIG. 6, the slew rate of the measurement pulse may be greater than the slew rate of the heating pulse.

The exemplary apparatuses described above may be combined in a system with an actuator. In particular, the actuator may comprise the SMA wire. The system may comprise the above-described controller. The controller may be configured to control current flow through the SMA wire so as to control a length of the SMA wire for actuation. The measurement circuit is configured to output the measurement to the controller, and the controller is configured to control the current flow based at least partly on the measurement.

An optical device may comprise a lens and the system described above. The actuator is for actuating the lens of the optical system. The optical device may be a miniature camera, for example in a mobile phone.

The circuits herein described are meant merely by way of example of the present techniques and are not intended to be limiting. Features shown in different Figures can be combined in the same apparatus. For example, the feature of connecting the measurement circuit to a terminal between the SMA wire and the drive switch (shown in FIGS. 4 and 5) may be applied to the apparatus shown in FIG. 2 or the apparatus shown in FIG. 3. As another example, the discharge switches shown in FIG. 5 may be implemented in the apparatus shown in FIG. 3.

Those skilled in the art will appreciate that while the foregoing has described what is considered to be the best mode and where appropriate other modes of performing present techniques, the present techniques should not be limited to the specific configurations and methods disclosed in this description of the preferred embodiment. Those skilled in the art will recognise that present techniques have a broad range of applications, and that the embodiments may take a wide range of modifications without departing from any inventive concept as defined in the appended claims.

The invention claimed is:

1. An apparatus for measuring the resistance of a shape memory alloy (SMA) wire, the apparatus comprising:
   an SMA wire;
   a sense resistor connected in series with the SMA wire; and
   a measurement circuit configured to perform a measurement indicative of the potential difference across at least the SMA wire scaled relative to a reference potential;
   wherein the reference potential is connected to a supply potential at the opposite side of the sense resistor from the SMA wire such that the reference potential is equal to the supply potential.

2. The apparatus of claim 1, further comprising a sample and hold circuit, wherein the sample and hold circuit is configured to sample a voltage for inputting to the measurement circuit.

3. The apparatus of claim 2, wherein the sample and hold circuit comprises a capacitor for storing charge during a settling time of the measurement circuit.

4. The apparatus of claim 3, comprising at least one discharge switch arranged in parallel to the capacitor, and wherein the at least one discharge switch is configured to selectably connect the capacitor to a terminal for at least partially discharging the capacitor.

5. The apparatus of claim 1, wherein the measurement circuit comprises an amplifier, and wherein the amplifier is configured to amplify the difference between potential difference across at least the SMA wire and an offset potential.

6. The apparatus of claim 5, comprising:
   a digital-to-analog converter, wherein the digital-to-analog converter is configured to generate and supply the offset potential to the amplifier.

7. The apparatus of claim 1, comprising a drive switch configured to allow current to flow through the SMA wire when closed, and wherein the measurement circuit is connected to a terminal between the drive switch and the SMA wire such that the measurement circuit is configured to perform the measurement indicative of the potential difference across the SMA wire but not across the drive switch.

8. A method of measuring the resistance of a shape memory alloy (SMA) wire, the method comprising:
   allowing current to flow through an SMA wire and a sense resistor connected in series with the SMA wire; and
   performing a measurement indicative of the potential difference across at least the SMA wire scaled relative to a reference potential;
   wherein the reference potential is connected to a supply potential at the opposite side of the sense resistor from the SMA wire such that the reference potential is equal to the supply potential.

* * * * *